(12) United States Patent
Schwarzenbach et al.

(10) Patent No.: US 12,100,727 B2
(45) Date of Patent: Sep. 24, 2024

(54) METHOD FOR MANUFACTURING A SUBSTRATE FOR A FRONT-FACING IMAGE SENSOR

(71) Applicant: Soitec, Bernin (FR)

(72) Inventors: Walter Schwarzenbach, Saint Nazaire les Eymes (FR); Ludovic Ecarnot, Grenoble (FR); Damien Massy, Grenoble (FR); Nadia Ben Mohamed, Echirolles (FR); Nicolas Daval, Goncelin (FR); Christophe Girard, Theys (FR); Christophe Maleville, Lumbin (FR)

(73) Assignee: Soitec, Bernin (FR)

( * ) Notice: Subject to any disclaimer, the term of this patent is extended or adjusted under 35 U.S.C. 154(b) by 476 days.

(21) Appl. No.: 17/418,148

(22) PCT Filed: Dec. 23, 2019

(86) PCT No.: PCT/FR2019/053281
§ 371 (c)(1),
(2) Date: Jun. 24, 2021

(87) PCT Pub. No.: WO2020/136344
PCT Pub. Date: Jul. 2, 2020

(65) Prior Publication Data
US 2022/0059603 A1    Feb. 24, 2022

(30) Foreign Application Priority Data
Dec. 24, 2018 (FR) ........................................ 1874134

(51) Int. Cl.
*H01L 27/146* (2006.01)
*H01L 21/265* (2006.01)
(Continued)

(52) U.S. Cl.
CPC .. *H01L 27/14683* (2013.01); *H01L 21/26506* (2013.01); *H01L 21/3223* (2013.01);
(Continued)

(58) Field of Classification Search
None
See application file for complete search history.

(56) References Cited

U.S. PATENT DOCUMENTS

| | | |
|---|---|---|
| 6,083,324 A | 7/2000 | Henley et al. |
| 6,548,382 B1 | 4/2003 | Henley et al. |

(Continued)

FOREIGN PATENT DOCUMENTS

| | | |
|---|---|---|
| CN | 1522461 A | 8/2004 |
| CN | 101258591 A | 9/2008 |

(Continued)

OTHER PUBLICATIONS

Japanese Notice of Reasons for Rejection for Application No. 2021-5335055 dated Mar. 28, 2023, 3 pages.
(Continued)

*Primary Examiner* — Nilufa Rahim
(74) *Attorney, Agent, or Firm* — TraskBritt

(57) ABSTRACT

A method of manufacturing a substrate for a front-facing image sensor, comprises:—providing a donor substrate comprising a semiconductor layer to be transferred,—providing a semiconductor carrier substrate,—bonding the donor substrate to the carrier substrate, an electrically insulating layer being at the bonding interface,—transferring the semiconductor layer to the carrier substrate,—implanting gaseous ions in the carrier substrate via the transferred semiconductor layer and the electrically insulating layer, and—after the implantation, epitaxially growing an additional semiconductor layer on the transferred semiconductor layer.

18 Claims, 6 Drawing Sheets

(51) Int. Cl.
  *H01L 21/322* (2006.01)
  *H01L 21/762* (2006.01)
  *H01L 31/18* (2006.01)

(52) U.S. Cl.
  CPC .... *H01L 21/3226* (2013.01); *H01L 21/76254* (2013.01); *H01L 27/1463* (2013.01); *H01L 31/1892* (2013.01)

(56) References Cited

U.S. PATENT DOCUMENTS

| | | | |
|---|---|---|---|
| 9,105,688 B2* | 8/2015 | Tauzin | H01L 21/76254 |
| 2004/0097055 A1 | 5/2004 | Henley et al. | |
| 2008/0070340 A1 | 3/2008 | Borrelli et al. | |
| 2010/0090303 A1 | 4/2010 | Takizawa | |
| 2012/0119336 A1 | 5/2012 | Akiyama | |
| 2013/0248862 A1* | 9/2013 | Inoue | H01L 27/1463 257/432 |
| 2015/0132923 A1 | 5/2015 | Gaudin | |
| 2017/0338143 A1 | 11/2017 | Peidous et al. | |
| 2019/0027576 A1* | 1/2019 | Yang | H01L 29/66636 |
| 2020/0194474 A1* | 6/2020 | Meynants | H01L 27/14636 |

FOREIGN PATENT DOCUMENTS

| | | | |
|---|---|---|---|
| CN | 104051478 A | | 9/2014 |
| CN | 108598105 A | | 9/2018 |
| JP | 2006-093175 A | | 4/2006 |
| JP | 2011014673 A | * | 1/2011 |
| JP | 2013-201188 A | | 10/2013 |
| TW | 201218365 A | | 5/2012 |
| WO | 2018/130781 A1 | | 7/2018 |

OTHER PUBLICATIONS

Taiwanese Office Action for Application No. 11121170540 dated Nov. 25, 2022, 3 pages.
International Search Report for International Application No. PCT/FR2019/053281 dated Apr. 8, 2020.
International Written Opinion for International Application No. PCT/FR2019/053281 dated Apr. 8, 2020, 5 pages.
Chinese Office Action for Application No. 201980085606.0 dated Dec. 25, 2023, 20 pages with English translation.
Chinese Office Action for Application No. 201980085606.0 dated Mar. 13, 2024, 17 pages with machine translation.
Siffert, P., The development and future of silicon technology, (Feb. 2009), Metallurgical Industry Press, pp. 129-135.

* cited by examiner

METHOD FOR MANUFACTURING A SUBSTRATE FOR A FRONT-FACING IMAGE SENSOR

CROSS-REFERENCE TO RELATED APPLICATIONS

This application is a national phase entry under 35 U.S.C. § 371 of International Patent Application PCT/FR2019/053281, filed Dec. 23, 2019, designating the United States of America and published as International Patent Publication WO 2020/136344 A1 on Jul. 2, 2020, which claims the benefit under Article 8 of the Patent Cooperation Treaty to French Patent Application Serial No. 1874134, filed Dec. 24, 2018.

TECHNICAL FIELD

The present disclosure relates to a process for fabricating a substrate for a front-side image sensor.

BACKGROUND

Semiconductor-on-insulator structures, and, in particular, Silicon-On-Insulator (SOI) substrates, are advantageous substrates for the fabrication of front-side image sensors.

An SOI substrate has, from its back face to its front face, a carrier substrate made of silicon that is doped to a certain degree, a silicon oxide layer referred to as a "buried oxide layer" (often referred to by the acronym "BOX"), and a layer referred to as an active silicon layer with doping that may be different from that of the carrier substrate. A matrix array of photodiodes, each one defining a pixel of the image sensor, is arranged in the active layer.

In some applications, the buried oxide layer is chosen to be relatively thin (i.e., to be less than 100 nm, and, in particular, between 20 nm and 50 nm, thick) in order to play the role of the dielectric of a capacitor by allowing the pixel to be biased via the back face. The portion of the carrier substrate located below the buried oxide layer is biased to a voltage that is different from the voltage of the active layer, which allows the interface between the dielectric layer and the active layer to be passivated. The voltage to be applied to the portion of the carrier substrate located below the buried oxide layer depends on the thickness of this layer. The potential difference to be applied is proportional to the thickness of the buried oxide layer: the thinner the buried oxide layer, the smaller the potential difference to be applied.

Another function of this buried oxide layer is to prevent parasitic signals due to the recombination, in the carrier substrate, of photons that were not absorbed during their travel through each pixel from being picked up (crosstalk prevention), with the understanding that the buried oxide layer may, depending on the chosen thickness, be only partially reflective and/or absorbent with respect to incident photons.

One drawback of the processes for fabricating image sensors is how sensitive they are to contamination by metals. Specifically, both the SOI substrate itself and the pixel may be exposed to metals during their fabrication processes. This exposure results, in particular, in the presence of metal atoms within the active layer. However, even at low concentrations, metal atoms, in particular, copper atoms, may lead to an unacceptable loss of image-sensor performance. Specifically, metal atoms are able to interact with the electric charges generated by photons captured in pixels and negatively affect their collection performance.

To overcome this drawback, it is known practice to form a layer for trapping metal atoms within the SOI substrate.

Document U.S. Pat. No. 6,083,324 thus describes the formation of a trapping layer in the active layer of the SOI substrate by ion-implanting gaseous species and then carrying out a heat treatment suitable for forming, from the implanted ions, microbubbles or precipitates. These microbubbles or precipitates form trap sites for metal atoms. However, this trapping layer, due to the cavities and interfaces that it forms in the pixel, may interfere with the trajectory of photons through the pixels and negatively affect the electrical performance of the image sensor.

Document US 2010/0090303 describes the formation of a trapping layer in the carrier substrate. More specifically, when the SOI substrate is formed using a SMART CUT™ layer transfer technique, the process for fabricating the SOI substrate comprises the following steps:
  providing a silicon donor substrate covered with a layer of silicon oxide that is intended to form the BOX and comprising a weakened zone delimiting a thin layer of silicon;
  providing a carrier substrate in which the trapping layer has been formed by ion implantation;
  bonding the donor substrate and the carrier substrate via the oxide layer;
  detaching the donor substrate along the weakened zone in order to transfer the thin layer of silicon and the oxide layer to the carrier substrate; and
  epitaxially growing an additional layer of silicon on top of the transferred thin layer until the desired thickness for the active layer of the image sensor has been obtained.

However, the surface state of the carrier substrate that has undergone ion implantation for the purpose of forming the trapping layer is of insufficient quality to provide a good bonding hold if the buried oxide layer is very thin, which is a notable drawback of this process, in particular, in the context of bonding thin oxides such as those targeted for a near-infrared front-side image sensor.

BRIEF SUMMARY

There is therefore still a need to form a trapping zone in the carrier substrate of a semiconductor-on-insulator structure for forming a front-side image sensor while guaranteeing good adhesion between the active layer and the carrier substrate.

To this end, the present disclosure proposes a process for fabricating a substrate for a front-side image sensor, comprising:
  providing a donor substrate comprising a semiconductor layer to be transferred;
  providing a semiconductor carrier substrate;
  bonding the donor substrate to the carrier substrate, an electrically insulating layer being at the bonding interface;
  transferring the semiconductor layer to the carrier substrate;
  implanting gaseous ions into the carrier substrate through the transferred semiconductor layer and the electrically insulating layer; and
  after the implantation, epitaxially growing an additional semiconductor layer on top of the transferred semiconductor layer.

Advantageously, the process comprises a heat treatment carried out at a temperature suitable for causing cavities to develop from the implanted gaseous ions, the cavities forming a layer for trapping metal atoms in the carrier substrate.

According to one embodiment, the heat treatment is carried out during the epitaxial growth of the additional semiconductor layer.

Preferably, the density of cavities in the trapping layer is higher than or equal to $10^{15}$ cavities/cm$^3$.

According to one embodiment, each semiconductor layer is a silicon layer.

According to one embodiment, the electrically insulating layer is a silicon oxide layer.

Alternatively, the electrically insulating layer consists of a stack of dielectric and/or metal materials.

Preferably, the thickness of the electrically insulating layer is between 5 nm and 400 nm, and preferably between 30 nm and 150 nm.

Preferably, the gaseous ions comprise helium ions.

According to one embodiment, the transfer of the semiconductor layer comprises:
  forming a weakened zone in the donor substrate in order to define the semiconductor layer to be transferred; and
  after bonding, the donor substrate is detached along the weakened zone.

The present disclosure also relates to a process for fabricating a front-side image sensor, comprising the fabrication of a substrate using the process as described above, the transferred semiconductor layer and the additional semiconductor layer together forming an active layer of the image sensor, and the formation, in the active layer, of a plurality of electrically isolating trenches in order to define a plurality of pixels.

BRIEF DESCRIPTION OF THE DRAWINGS

Other features and advantages of the present disclosure will emerge from the detailed description that follows, with reference to the accompanying drawings in which.

To make the drawings clearer, the various layers have not been drawn to scale. Reference signs that are identical from one figure to the next have been used to reference elements that are identical or that perform the same function.

DETAILED DESCRIPTION

Figure 1A:
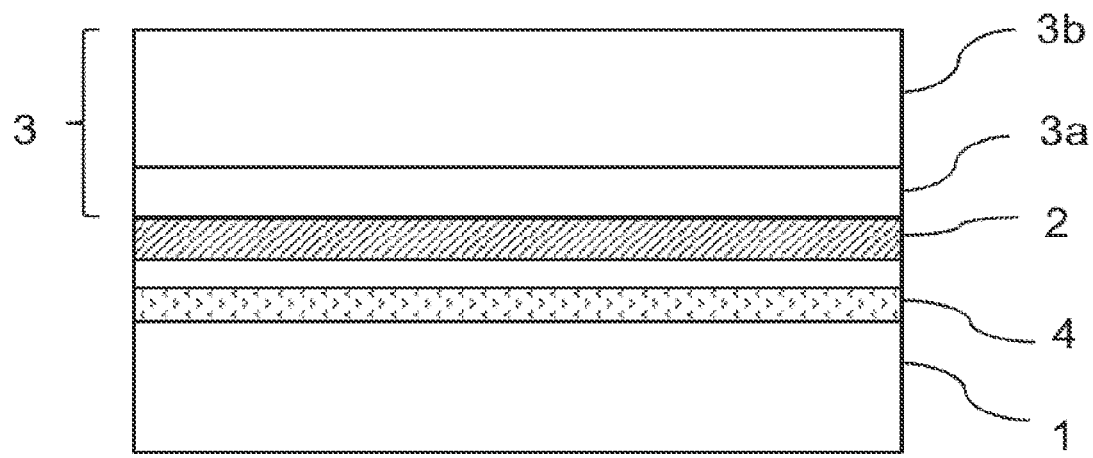
FIG. 1A is a sectional view of an SOI substrate for an image sensor according to one embodiment of the present disclosure.

FIG. 1A illustrates an SOI substrate for an image sensor according to one embodiment of the present disclosure.

The substrate successively comprises, from its back face to its front face, a carrier substrate 1, an electrically insulating layer 2 and a semiconductor layer 3, referred to as the active layer, which is intended for the formation of the pixels of the image sensor.

A trapping layer 4 for trapping metal atoms is arranged at a certain depth in the carrier substrate 1, not necessarily in contact with the electrically insulating layer 2. As will be described in detail below, the trapping layer 4 comprises cavities that develop from gaseous ions implanted into the carrier substrate under the effect of a heat treatment. The density of cavities in the trapping layer 4 is advantageously higher than or equal to $10^{15}$ cavities/cm$^3$. The cavities make it possible to capture metal atoms that are present in the SOI substrate in the vicinity of the electrically insulating layer 2, which may negatively affect the correct operation of the sensor. These atoms may be initially present in the carrier substrate 1 and/or in the active layer 3 and diffuse through the SOI substrate under the effect of heat treatments until reaching the trapping layer 4, where they are captured.

The carrier substrate is advantageously a silicon, in particular, monocrystalline silicon, substrate.

The electrically insulating layer 2 may be a layer of silicon oxide, which is a conventional insulator in the field of silicon-on-insulator substrates.

Alternatively, the electrically insulating layer may consist of a stack of various dielectric and/or metal materials, such as what is known as an "ONO," i.e., oxide-nitride-oxide, stack. The constituent materials of the stack are advantageously chosen so as to increase the reflectivity of the electrically insulating layer in the infrared in comparison with a layer of silicon oxide of the same total thickness. Preferably, a metal layer is encapsulated between two dielectric layers, which thus prevents any metal contamination of the active layer. This makes it possible to avoid the generation of electrical defects at the interface between the active layer and the electrically insulating layer and recombinations between the semiconductor material of the active layer and the metal components of the image sensor, which could dope the active layer.

Figure 1B:
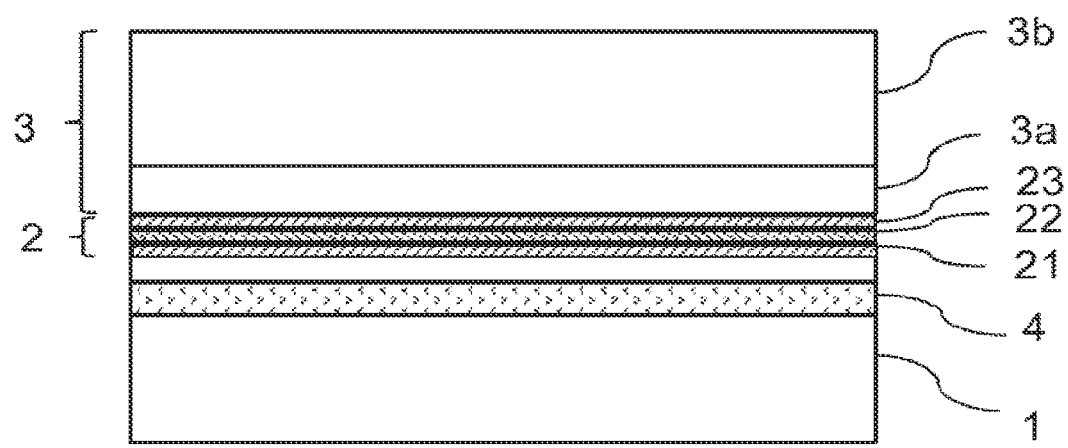
FIG. 1B is a sectional view of a substrate according to one variant of FIG. 1A.

According to one particular embodiment illustrated in FIG. 1B, the electrically insulating layer 2 comprises a layer 22 of silicon nitride between two layers 21, 23 of silicon oxide. The thickness of the layer 21, which is arranged on the carrier substrate 1 side, is between 50 nm and 500 nm, the thickness of the layer 23, which is arranged on the active layer 3 side, is between 5 nm and 50 nm and the thickness of the layer 22 is between 10 nm and 100 nm. Such an electrically insulating layer has the advantage of reflecting the photons transmitted through the active layer 3 better than a layer of silicon oxide of the same thickness of the substrate of FIG. 1A.

Particularly advantageously, whether it consists of one or of several materials, the electrically insulating layer 2 is thin, i.e., it is between 5 nm and 400 nm, and, preferably, between 30 nm and 150 nm, thick. Such a layer forms no barrier to the diffusion of metal, in particular, copper, atoms. It is therefore not necessary, as in document US 2010/0090303, to damage the electrically insulating layer locally in order to allow atoms to pass through.

The active layer is advantageously monocrystalline. As schematically shown in FIG. 1, the active layer 3 is formed by stacking a first semiconductor layer 3a and an additional semiconductor layer 3b, the layer 3b being fabricated by epitaxy on top of the layer 3a, which then serves as a seed layer. The materials of the layers 3a and 3b advantageously exhibit similar lattice parameters and coefficients of thermal expansion that make it possible to minimize the formation of crystal defects within the layer 3b as it is epitaxially grown. According to one preferred embodiment, the layers 3a and 3b consist of the same material, typically silicon or silicon-germanium. The layers 3a and/or 3b may potentially be doped.

The thickness of the active layer 3 is typically greater than or equal to 1 μm.

A process for fabricating the substrate of FIG. 1A based on the SMART CUT™ method will now be described with reference to FIGS. 2 to 5.

Figure 2:
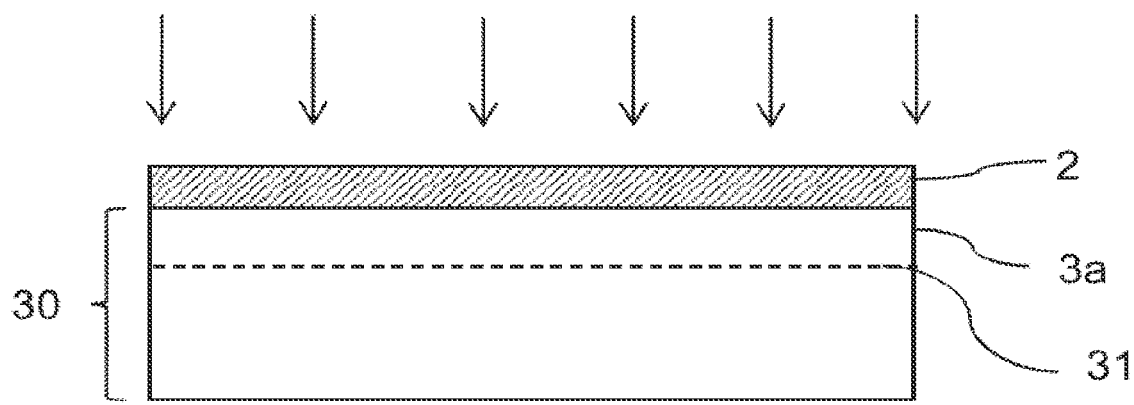
FIG. 2 schematically illustrates the implantation of atomic species into a donor substrate in order to form a weakened zone there delimiting a semiconductor layer to be transferred.

With reference to FIG. 2, a donor substrate 30 covered with the electrically insulating layer 2 is provided. The electrically insulating layer may be formed by thermally oxidizing the material of the donor substrate and/or by depositing one or more dielectric and/or metal layers. A weakened zone, which delimits the semiconductor layer 3a to be transferred, is formed by implanting atomic species (represented by arrows) into the donor substrate 30. The atomic species implanted for this purpose advantageously comprise hydrogen and/or helium.

Figure 3:
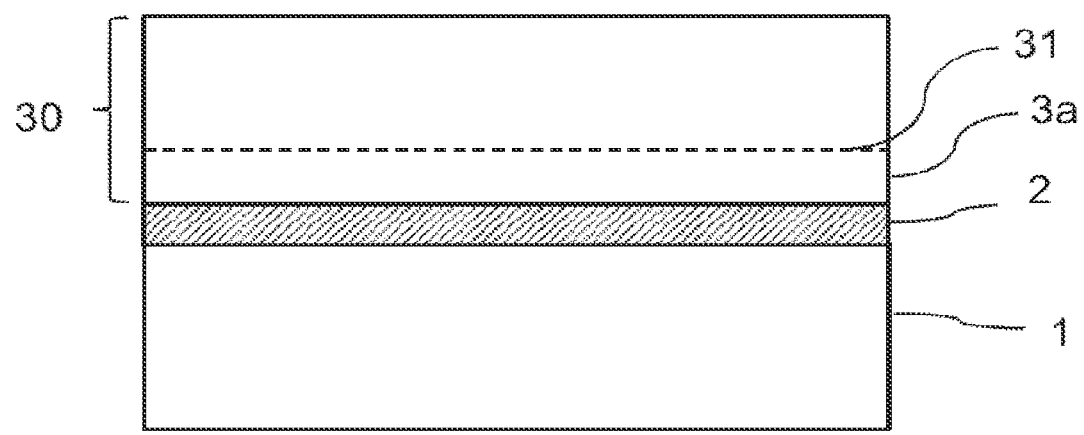
FIG. 3 schematically illustrates the bonding of the weakened donor substrate of FIG. 2 to a carrier substrate.

With reference to FIG. 3, the donor substrate 30 is bonded to the carrier substrate 1, the electrically insulating layer 2 being at the bonding interface.

Figure 4:
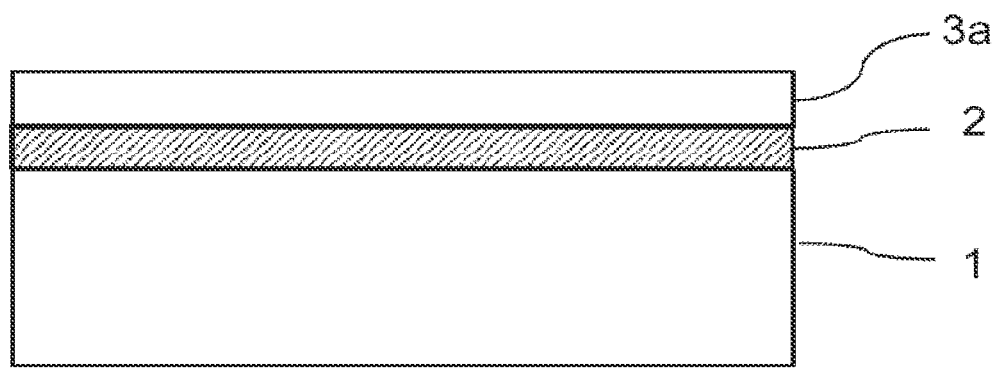
FIG. 4 schematically illustrates the transfer of the semiconductor layer to the carrier substrate in order to form an SOI structure.

With reference to FIG. 4, the donor substrate 30 is detached along the weakened zone 31 in order to transfer the semiconductor layer 3a to the carrier substrate 1.

Figure 5:
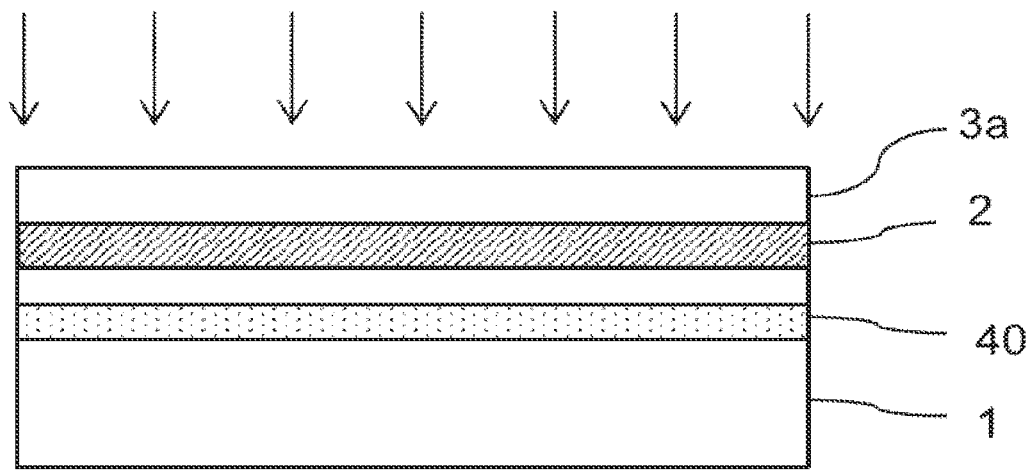
FIG. 5 schematically illustrates the implantation of helium into the SOI structure of FIG. 4.

With reference to FIG. 5, gaseous (for example, helium) ions are implanted into the carrier substrate 1 through the semiconductor layer 3a and the electrically insulating layer 2. A person skilled in the art is capable of defining the implantation parameters, in particular, the dose and implantation energy, so as to localize the gaseous ions 40 in a layer in the thickness of the carrier substrate 1. By way of indication, a dose of between 1E16 atoms/cm$^2$ and 5E17 atoms/cm$^2$ is suitable for obtaining a density of cavities of at least 10E15 cavities/cm$^3$. The implantation energy is typically between a few keV and 120 keV. A person skilled in the art will choose a suitable energy according to the thicknesses of the layers through which the ions have to pass for the ions to be localized in the carrier substrate below the electrically insulating layer.

A heat treatment is next carried out to develop cavities from the implanted gaseous ions in order to form a layer for trapping metal atoms. Generally speaking, this treatment involves heating the substrate to a temperature of between 850° C. and 1200° C. for a duration of between 30 minutes and 180 minutes. This heat treatment may be carried out as a specific step in the process. However, it may be advantageous to use the thermal budget of another step in the process, for example, a step of finishing the SOI substrate (such as an anneal for smoothing or for healing defects) or the epitaxy step carried out in order to grow the additional semiconductor layer 3b on top of the transferred semiconductor layer 3a.

As an alternative to the SMART CUT™ process described above, the semiconductor layer may be transferred, after bonding the donor substrate to the carrier substrate, by thinning the donor substrate from its face opposite the bonding interface, for example, by etching, until the desired thickness for the transferred semiconductor layer is obtained. The formation of the weakened zone is not necessary in this case.

Forming the trapping layer after bonding the donor substrate to the carrier substrate, rather than before as described in document US 2010/0090303, makes it possible to ensure that the surfaces to be bonded are of optimum quality and consequently that the adhesion between the two substrates is good, even if the electrically insulating layer is thin. Additionally, implanting the gaseous ions before the epitaxy of the additional semiconductor layer makes it possible to minimize the implantation energy and to avoid damaging the active layer.

Figure 6:
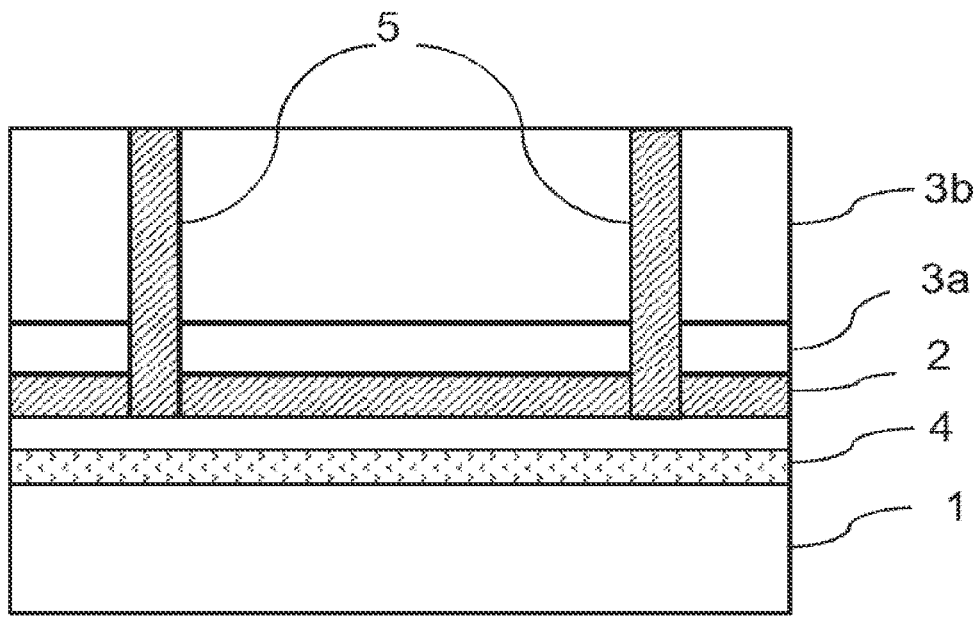
FIG. 6 illustrates the substrate obtained after forming electrically isolating trenches in the substrate of FIG. 1 in order to singulate each pixel of the image sensor, the substrate having undergone a re-epitaxy step beforehand.

With reference to FIG. 6, the additional semiconductor layer 3b is grown by epitaxy on top of the transferred semiconductor layer 3a until the desired thickness for the active layer 3 is obtained. As mentioned above, the thermal budget of this epitaxy may be used to develop the cavities that form the trapping layer 4. Next, trenches are formed through the active layer 3 down into the electrically insulating layer 2, and the trenches 5 are filled with a dielectric material in order to electrically isolate the pixels of the image sensor.

Experimental Results

Figure 7:
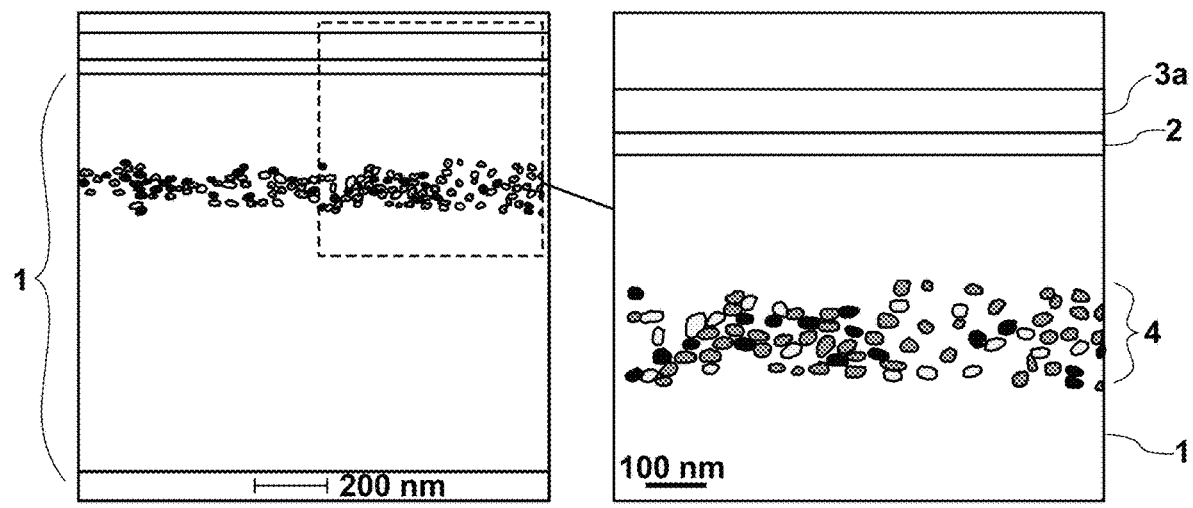
FIG. 7 shows images of a section of the substrate of FIG. 5 produced by transmission electron microscopy (the right-hand image being an enlargement of the left-hand image)

SOI substrates such as illustrated in FIG. 5 have been produced and the trapping layer has been formed by developing cavities from the implanted gaseous ions by heating some of the SOI substrates to a temperature of 950° C. for 40 minutes (see FIG. 7).

Figure 8:
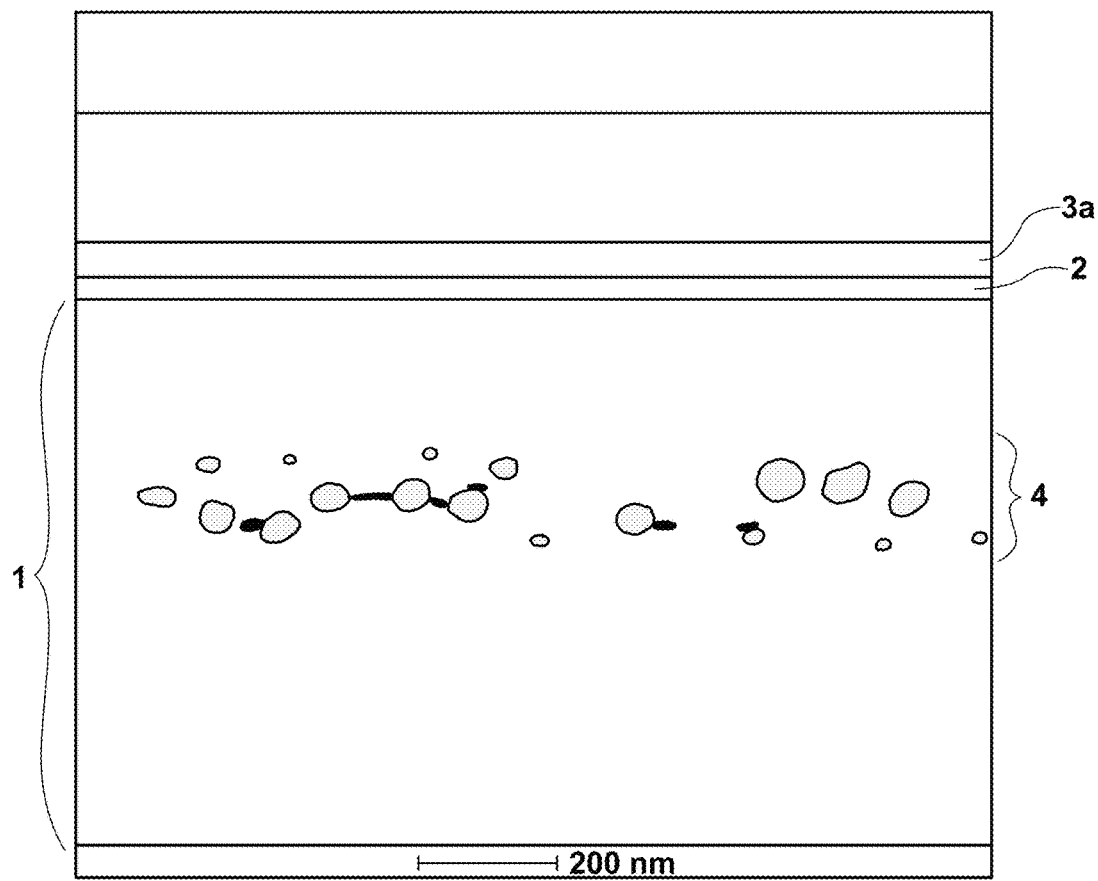
FIG. 8 is an image produced by transmission electron microscopy of a section of the substrate of FIG. 5 after an additional heat treatment has been applied to the substrate with respect to the images of FIG. 7.

The substrates then underwent heat treatments that SOI substrates, including the layer for trapping metal atoms, may undergo in order to check that the trapping layer is stable and remains operational even after having undergone a heat treatment with a high thermal budget (see FIG. 8). It is assumed that the thermal budget of a treatment at 1100° C. for two hours is the maximum thermal budget that allows the trapping properties of the cavity layer to be conserved. This thermal budget is compatible with finishing steps and potentially epitaxy.

FIG. 7 shows images of a section of the substrate of FIG. 5 produced by transmission electron microscopy (the right-hand image being an enlargement of the left-hand image) after a heat treatment for developing the cavities has been carried out. Within the carrier substrate 1 it is possible to see the cavities arranged in a trapping layer 4 forming a layer for trapping metal atoms. In the example illustrated, the thickness of the trapping layer 4 is 179 nm and it is buried at a depth of 205 nm below the interface between the carrier substrate 1 and the electrically insulating layer 2.

FIG. 8 is an image produced by transmission electron microscopy of a section of the substrate of FIG. 5 after an additional heat treatment has been applied to the substrate with respect to the images of FIG. 7, the heat treatment being carried out at a temperature of up to 1100° C. for a duration of less than or equal to two hours. In the thickness of the carrier substrate 1, at the implantation depth of the gaseous ions, it is possible to see cavities arranged in the trapping layer 4, which forms a layer for trapping metal atoms.

Figure 9:
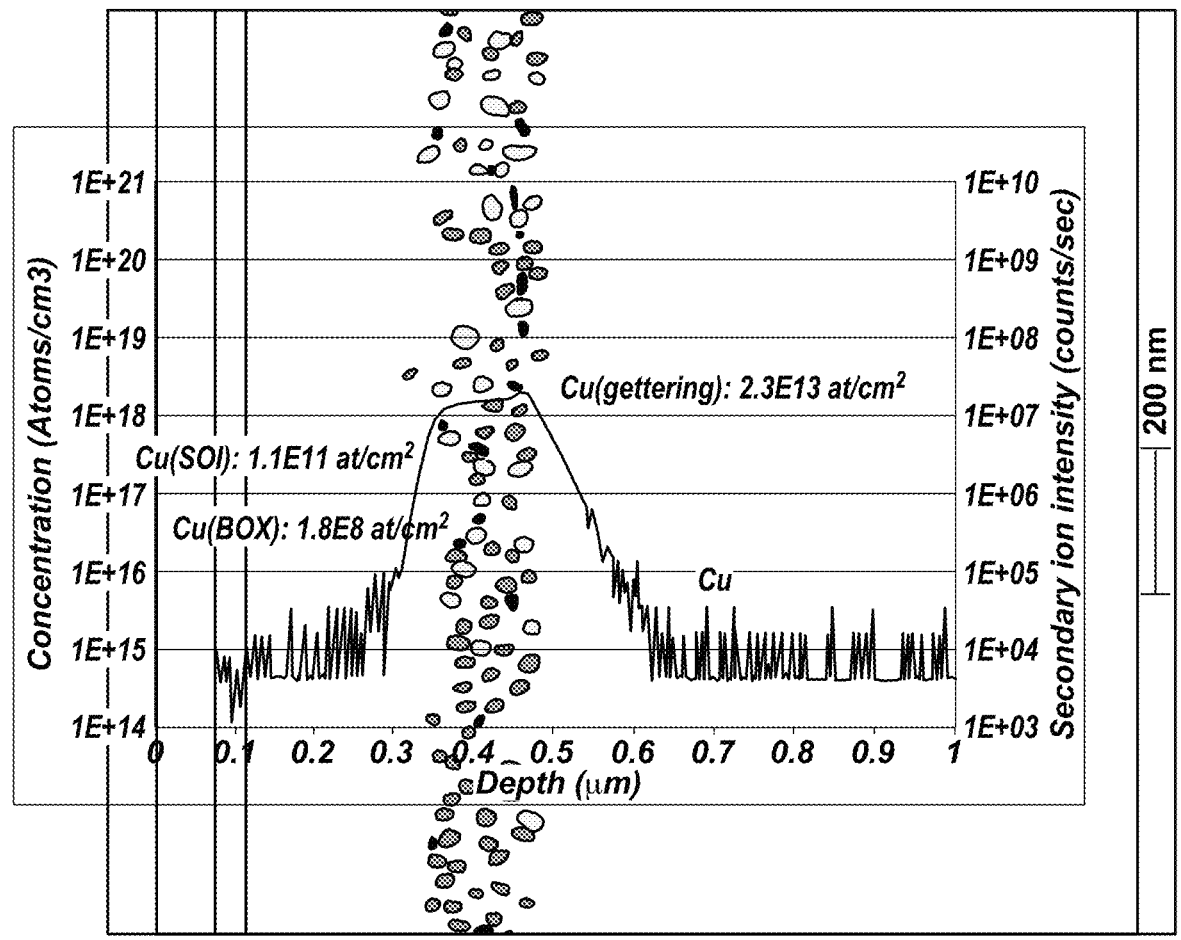
FIG. 9 shows a measurement, taken by secondary-ion mass spectrometry (SIMS), of copper concentration illustrating the diffusion thereof within the substrate of FIG. 5, superposed over an image of a section of the substrate produced by transmission electron microscopy.

FIG. 9 shows a measurement, taken by secondary-ion mass spectrometry (SIMS), of copper concentration in the substrate of FIG. 5, superposed over an image of a section of the substrate produced by transmission electron microscopy. To carry out this measurement, a layer of copper was deposited on top of the semiconductor layer 3a and a heat treatment (800° C. for two hours) was carried out to diffuse the copper atoms into the substrate. This heat treatment was chosen for demonstration purposes to ensure, taking into account the physical diffusion properties of copper in silicon and silicon oxide, complete dispersion of this element into the material. This measurement thus reflects the ability of copper atoms to pass through the electrically insulating layer 2 and be trapped by the trapping layer 4. Thus, while the concentration of copper atoms in the semiconductor layer 3a is about 1.1E11 atoms/cm$^3$ and about 1.8E9 atoms/cm$^3$ in the electrically insulating layer, the curve shows a peak at the trapping layer 4 with a concentration of copper atoms of about 2.3E13 atoms/cm$^3$. The concentration of copper atoms below the trapping layer 4 is very low.

Figure 10:
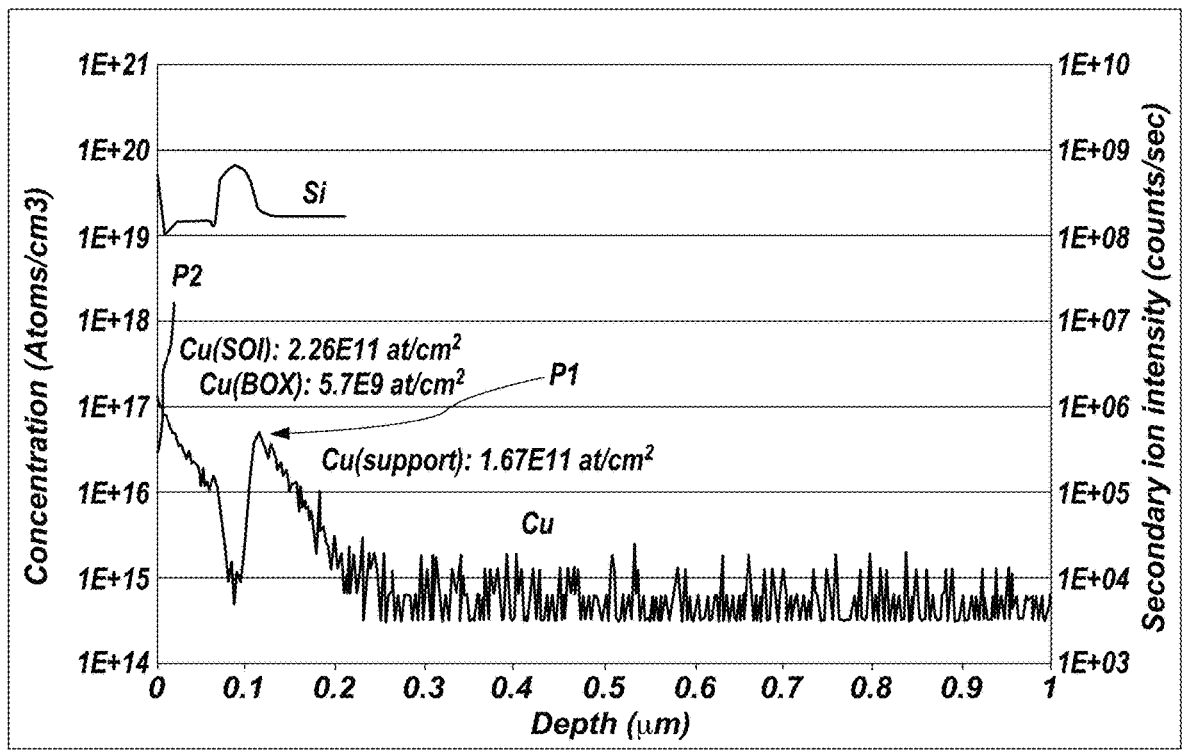
FIG. 10 shows a SIMS measurement of copper concentration illustrating the diffusion thereof within a substrate like that of FIG. 5 but without a trapping layer.
Figure 11:
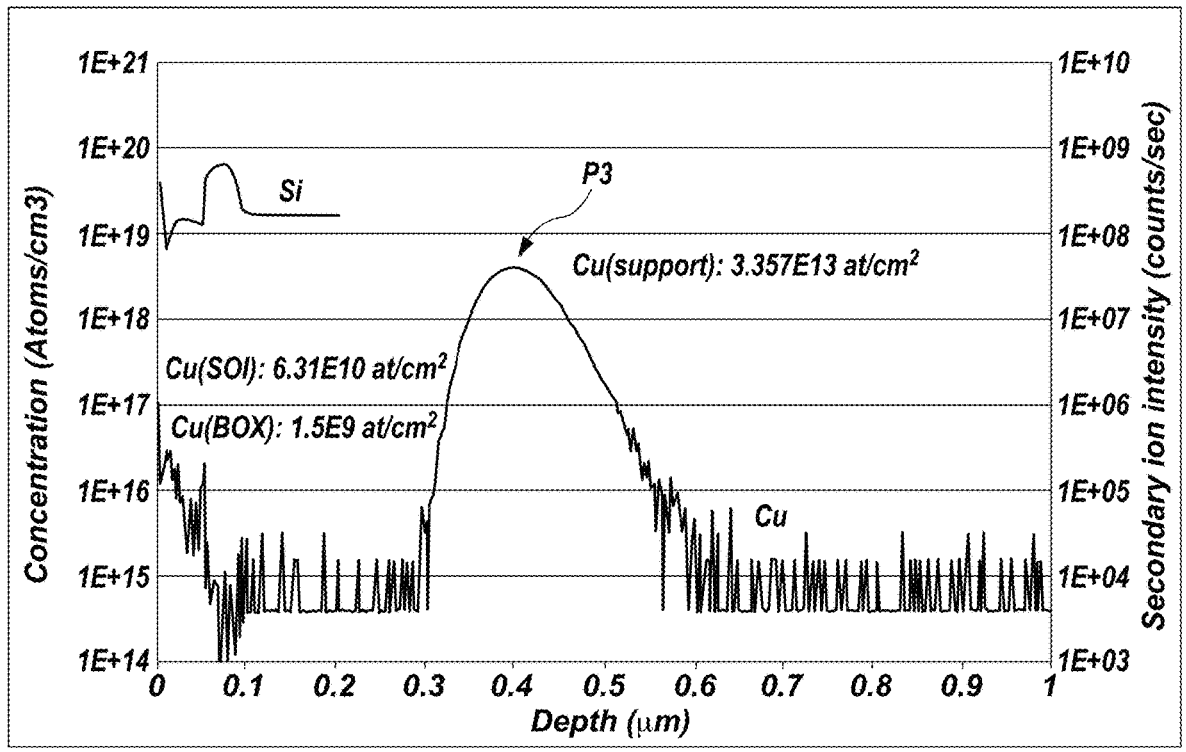
FIG. 11 shows a SIMS measurement of copper concentration illustrating the diffusion thereof within the substrate of FIG. 5.

FIGS. 10 and 11 show a SIMS measurement of copper concentration within a substrate like that of FIG. 5 without and with the trapping layer 4, respectively. To carry out this measurement, a layer of copper was deposited on the back face of the carrier substrate 1 and a heat treatment (800° C. for two hours) was carried out to diffuse the copper atoms into the substrate. In the case of FIG. 10 (no trapping layer), a high concentration of copper atoms is observed in the carrier substrate 1 below the electrically insulating layer (peak P1) and a high concentration of copper atoms is observed in the transferred layer in the vicinity of the free surface of the layer (peak P2). In the case of FIG. 11 (a trapping layer according to the present disclosure being present), it is observed that the copper-atom concentration peak P3 is localized in the trapping layer.

REFERENCES

U.S. Pat. No. 6,083,324
US 2010/0090303

The invention claimed is:

1. A method of fabricating a substrate for a front-side image sensor, comprising:
    providing a donor substrate comprising a semiconductor layer to be transferred;
    providing a semiconductor carrier substrate;
    bonding the donor substrate to the carrier substrate, an electrically insulating layer being at a bonding interface;
    transferring the semiconductor layer to the carrier substrate;
    implanting gaseous ions into the carrier substrate through the transferred semiconductor layer and the electrically insulating layer; and
    after the implantation, epitaxially growing an additional semiconductor layer on top of the transferred semiconductor layer; and
    heat treating the implanted substrate at a temperature suitable for causing cavities to develop from the implanted gaseous ions, the cavities forming a layer for trapping metal atoms in the carrier substrate, wherein the heat treatment is carried out during the epitaxial growth of the additional semiconductor layer.

2. The method of claim 1, wherein a density of the cavities in the trapping layer is higher than or equal to $10^{15}$ cavities/cm$^3$.

3. The method of claim 2, wherein each semiconductor layer comprises a silicon layer.

4. The method of claim 3, wherein the electrically insulating layer comprises a silicon oxide layer.

5. The method of claim 4, wherein the electrically insulating layer comprises a stack of dielectric and/or metal materials.

6. The method of claim 5, wherein a thickness of the electrically insulating layer is between 5 nm and 400 nm.

7. The method of claim 6, wherein the gaseous ions comprise helium ions.

8. The method of claim 7, wherein the transfer of the semiconductor layer comprises:
    forming a weakened zone in the donor substrate to define the semiconductor layer to be transferred; and
    after bonding, detaching the donor substrate along the weakened zone.

9. The method of claim 6, wherein a thickness of the electrically insulating layer is between 30 nm and 150 nm.

10. A method of fabricating a front-side image sensor, comprising:
    the method of fabricating the substrate according to claim 1, wherein the transferred semiconductor layer and the additional semiconductor layer together form an active layer of the image sensor, and
    forming, in the active layer, a plurality of electrically isolating trenches to define a plurality of pixels.

11. A method of fabricating a front-side image sensor, comprising:
    fabricating a substrate for the front-side image sensor, comprising:
    providing a donor substrate comprising a semiconductor layer to be transferred;
    providing a semiconductor carrier substrate;
    bonding the donor substrate to the carrier substrate, an electrically insulating layer being at a bonding interface;
    transferring the semiconductor layer to the carrier substrate;
    implanting gaseous ions into the carrier substrate through the transferred semiconductor layer and the electrically insulating layer; and
    after the implantation, heat treating the implanted carrier substrate a temperature suitable for causing cavities to develop from the implanted gaseous ions and epitaxially growing an additional semiconductor layer on top of the transferred semiconductor layer, wherein the heat treatment is carried out during the epitaxial growth of the additional semiconductor layer, and wherein the transferred semiconductor layer and the additional semiconductor layer together form an active layer of the image sensor; and
    forming a plurality of electrically isolating trenches extending through the active layer to the electrically insulating layer of the substrate for the front-side image sensor, the plurality of electrically isolating trenches defining a plurality of pixels.

12. The method of claim 11, wherein a density of the cavities in the trapping layer is higher than or equal to $10^{15}$ cavities/cm$^3$.

13. The method of claim 11, wherein each semiconductor layer comprises a silicon layer.

14. The method of claim 11, wherein the electrically insulating layer comprises a silicon oxide layer.

15. The method of claim 11, wherein the electrically insulating layer comprises a stack of dielectric and/or metal materials.

16. The method of claim 11, wherein a thickness of the electrically insulating layer is between 5 nm and 400 nm.

17. The method of claim 11, wherein the gaseous ions comprise helium ions.

18. The method of claim 11, wherein the transfer of the semiconductor layer comprises:
   forming a weakened zone in the donor substrate to define the semiconductor layer to be transferred; and
   after bonding, detaching the donor substrate along the weakened zone.

\* \* \* \* \*

UNITED STATES PATENT AND TRADEMARK OFFICE
CERTIFICATE OF CORRECTION

PATENT NO. : 12,100,727 B2
APPLICATION NO. : 17/418148
DATED : September 24, 2024
INVENTOR(S) : Walter Schwarzenbach et al.

It is certified that error appears in the above-identified patent and that said Letters Patent is hereby corrected as shown below:

In the Specification
Column 5, Line 54, change "5E17atoms/cm$^2$" to --5E17 atoms/cm$^2$--

In the Claims
Claim 11, Column 8, Line 47, change "substrate a temperature" to --substrate at a temperature--

Signed and Sealed this
Twenty-sixth Day of November, 2024

Katherine Kelly Vidal
*Director of the United States Patent and Trademark Office*